United States Patent
Cho et al.

(10) Patent No.: US 11,908,881 B2
(45) Date of Patent: Feb. 20, 2024

(54) LED DISPLAY APPARATUS HAVING MICRO LED MODULE

(71) Applicant: SEOUL VIOSYS CO., LTD., Gyeonggi-do (KR)

(72) Inventors: Dae Sung Cho, Gyeonggi-do (KR); So Ra Lee, Gyeonggi-do (KR)

(73) Assignee: SEOUL VIOSYS CO., LTD., Gyeonggi-do (KR)

( * ) Notice: Subject to any disclaimer, the term of this patent is extended or adjusted under 35 U.S.C. 154(b) by 145 days.

(21) Appl. No.: 17/152,303

(22) Filed: Jan. 19, 2021

(65) Prior Publication Data

US 2021/0225930 A1    Jul. 22, 2021

Related U.S. Application Data

(60) Provisional application No. 63/036,698, filed on Jun. 9, 2020, provisional application No. 62/963,781, filed on Jan. 21, 2020.

(51) Int. Cl.
| | | |
|---|---|---|
| *H01L 27/15* | (2006.01) | |
| *H01L 33/08* | (2010.01) | |
| *H01L 33/62* | (2010.01) | |
| *H01L 25/075* | (2006.01) | |

(52) U.S. Cl.
CPC ........ *H01L 27/156* (2013.01); *H01L 25/0753* (2013.01); *H01L 33/08* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 9,935,153 B1 | 4/2018 | Jung et al. | |
| 2020/0163233 A1* | 5/2020 | Brackley | H05K 5/0021 |
| 2020/0243738 A1* | 7/2020 | Feng | G02F 1/13336 |

FOREIGN PATENT DOCUMENTS

| | | |
|---|---|---|
| JP | 05042718 A | 2/1993 |
| KR | 100783480 B1 | 12/2007 |
| KR | 1020120125325 A | 11/2012 |
| KR | 1020180075827 A | 7/2018 |
| KR | 1020180118488 A | 10/2018 |
| KR | 1020190008746 A | 1/2019 |
| KR | 1020190039313 A | 4/2019 |
| KR | 1020190109222 A | 9/2019 |

(Continued)

OTHER PUBLICATIONS

Machine-made English-language translation of KR20210020677A.*

(Continued)

*Primary Examiner* — Robert K Carpenter
(74) *Attorney, Agent, or Firm* — Oblon, McClelland, Maier & Neustadt, L.L.P.

(57) ABSTRACT

A display apparatus is provided. The display apparatus includes a display substrate, a first micro LED module disposed on the display substrate, and a second micro LED module disposed on the display substrate and adjacent to the first micro LED module. The first micro LED module and the second micro LED module have side surfaces facing each other. The side surfaces facing each other of the first micro LED module and the second micro LED module are inclined in an identical direction with respect to an upper surface of the display substrate.

20 Claims, 11 Drawing Sheets

(56) References Cited

FOREIGN PATENT DOCUMENTS

| | | | |
|---|---|---|---|
| KR | 1020190119438 A | | 10/2019 |
| KR | 20210020677 A | * | 2/2021 |
| WO | 2017150910 A1 | | 9/2017 |
| WO | 2019014036 A1 | | 1/2019 |
| WO | WO-2019074278 A1 | * | 4/2019 ........... H01L 25/075 |

OTHER PUBLICATIONS

International Search Report for corresponding International Application No. PCT/KR2021/000827, dated Apr. 20, 2021, English Translation, 2 pages.
International Search Report for corresponding International Application No. PCT/KR2021/000848, dated May 6, 2021, English Translation, 5 pages.
International Search Report for International Application No. PCT/KR2021/000779, dated Apr. 12, 2021, English Translation, 2 pages.

* cited by examiner

RELATED ART

RELATED ART

RELATED ART

LED DISPLAY APPARATUS HAVING MICRO LED MODULE

CROSS-REFERENCE OF RELATED APPLICATIONS AND PRIORITY

The present application is a Non-provisional Application which claims priority to the benefit of U.S. Provisional Application Nos. 62/963,781 filed Jan. 21, 2020 and 63/036,698 filed Jun. 9, 2020, the disclosures of which are incorporated by reference their entirety.

TECHNICAL FIELD

The present disclosure relates to an LED display apparatus, and more particularly, to an LED display apparatus having tile-shaped micro LED modules.

BACKGROUND

As an inorganic light source, light emitting diodes are for use in various fields including displays, vehicular lamps, general lighting, and the like. With various advantages such as long lifespan, low power consumption, and rapid response, light emitting diodes have been replacing existing light sources.

For example, a display apparatus realizes various colors through mixture of blue, green and red light. In order to realize various images, the display apparatus includes a plurality of pixels, each of which has subpixels corresponding to blue, green and red light, respectively. A color of a certain pixel is determined based on the colors of the sub-pixels so that images can be realized through combination of such pixels.

Light emitting diodes have been used as backlight light sources in display apparatuses. However, LED displays may directly realize images using the light emitting diodes.

As LEDs can emit various colors depending upon materials thereof, it is possible to provide a display apparatus by arranging individual LED chips emitting blue, green and red light on a two-dimensional plane. However, when one LED chip is arranged in each sub-pixel, the number of LED chips may be increased, which may require excessive time for a mounting process during manufacture. Accordingly, stacked light emitting devices may reduce the time required for the mounting process. For example, by manufacturing a light emitting device in which a red LED, a blue LED, and a green LED are stacked, red, blue, and green light may be implemented using one light emitting device. Accordingly, one pixel that emits red, blue, and green light may be provided with a single light emitting device, thereby reducing the number of light emitting devices mounted on the display device.

FIG. 1 is a plan view illustrating an LED display apparatus 10 according to the related art. Referring to FIG. 1, the display apparatus 10 includes a display substrate 11 and light emitting devices R, G, and B. Each of the light emitting devices R, G, and B is a micro LED, which has a form factor of about 10000 µm² or less, which is available in the art.

Each of red, green, and blue light emitting devices R, G, and B is a sub-pixel, and sub-pixels constitute one pixel P. A plurality of pixels P is arranged on the display substrate 11 and an image is implemented with these pixels P. The display substrate 11 is a substrate corresponding to an entire screen of the display apparatus, and in some embodiments, millions to tens of millions of micro LEDs are mounted on the display substrate 11.

However, due to the small form factor of micro LEDs, it is difficult to handle micro LEDs, and thus, it is not easy to transfer and mount millions to tens of millions of micro LEDs on a display panel. Moreover, the micro LEDs may be damaged by an external impact, and thus, defects may be formed in the micro LEDs during transportation.

Accordingly, when all of the micro LEDs are mounted on the display substrate 11 corresponding to one screen, a manufacturing yield of the display apparatus is not favorable. Moreover, since a large number of light emitting devices R, G, and B have to be mounted on the large-area display substrate 11, workability is poor.

These drawbacks may occur for a pixel configured to be using a stacked light emitting device. To solve these drawbacks, a tile-shaped micro LED module may be used.

FIG. 2 is a plan view illustrating a display apparatus 20 including micro LED modules according to the related art, and FIG. 3 is a schematic partial cross-sectional view taken along line A-A' of FIG. 2.

Referring to FIG. 2, the display apparatus 20 includes a display substrate 21 and tile-shaped micro LED modules T. The micro LED modules T include light emitting devices R, G, and B, and are arranged on the display substrate 21.

The micro LED module T may include a plurality of pixels, and these modules T may be mounted on the display substrate 21 to form an entire screen. Accordingly, instead of mounting all of the light emitting devices R, G, and B on the display substrate 21, the light emitting devices R, G, and B may be mounted on a plurality of micro LED modules T, and the display apparatus 20 may be provided by mounting the LED modules T on the display substrate 21.

As the display apparatus 20 may be manufactured by selecting favorable LED modules T, a manufacturing yield of the display apparatus 20 may be improved, and workability may also be improved.

However, when the display apparatus 20 is manufactured by tiling the plurality of micro LED modules T, the micro LED modules T are spaced apart from one another in consideration of tolerance generated when the micro LED modules T are manufactured and mounted, as indicated by a dotted line in FIG. 3.

As the micro LED modules T are spaced apart, a space between them may appear on the screen as, for example, a linear defect. This linear defect can be observed not only in an idle state in which an image is not displayed, but also when an image is displayed.

SUMMARY

Exemplary embodiments provide a display apparatus capable of reducing linear defects observed when micro LED modules are arranged using a tiling technique. The exemplary embodiments also provide a micro LED module of a novel structure.

Exemplary embodiments provide a display apparatus. The display apparatus includes a display substrate, a first micro LED module disposed on the display substrate, and a second micro LED module disposed on the display substrate and adjacent to the first micro LED module. The first micro LED module and the second micro LED module have side surfaces facing each other. The side surfaces facing each other of the first micro LED module and the second micro LED module are inclined in an identical direction with respect to an upper surface of the display substrate.

Exemplary embodiments provide a micro LED module including a substrate having a lower surface, an upper surface, and side surfaces, micro LEDs arranged on the upper surface of the substrate. At least one side surface of the substrate is inclined to have an acute angle or an obtuse angle with respect to the upper surface of the substrate.

DETAILED DESCRIPTION OF EMBODIMENTS

Figure 1:
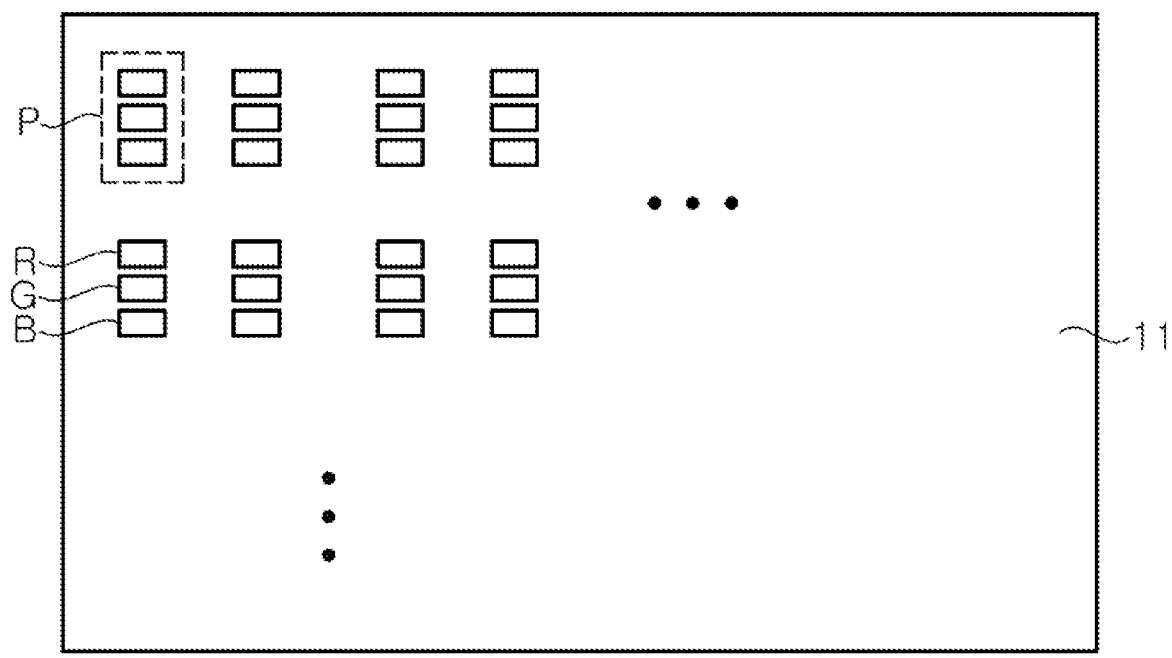
FIG. 1 is a plan view illustrating an LED display apparatus according to the related art.
Figure 2:
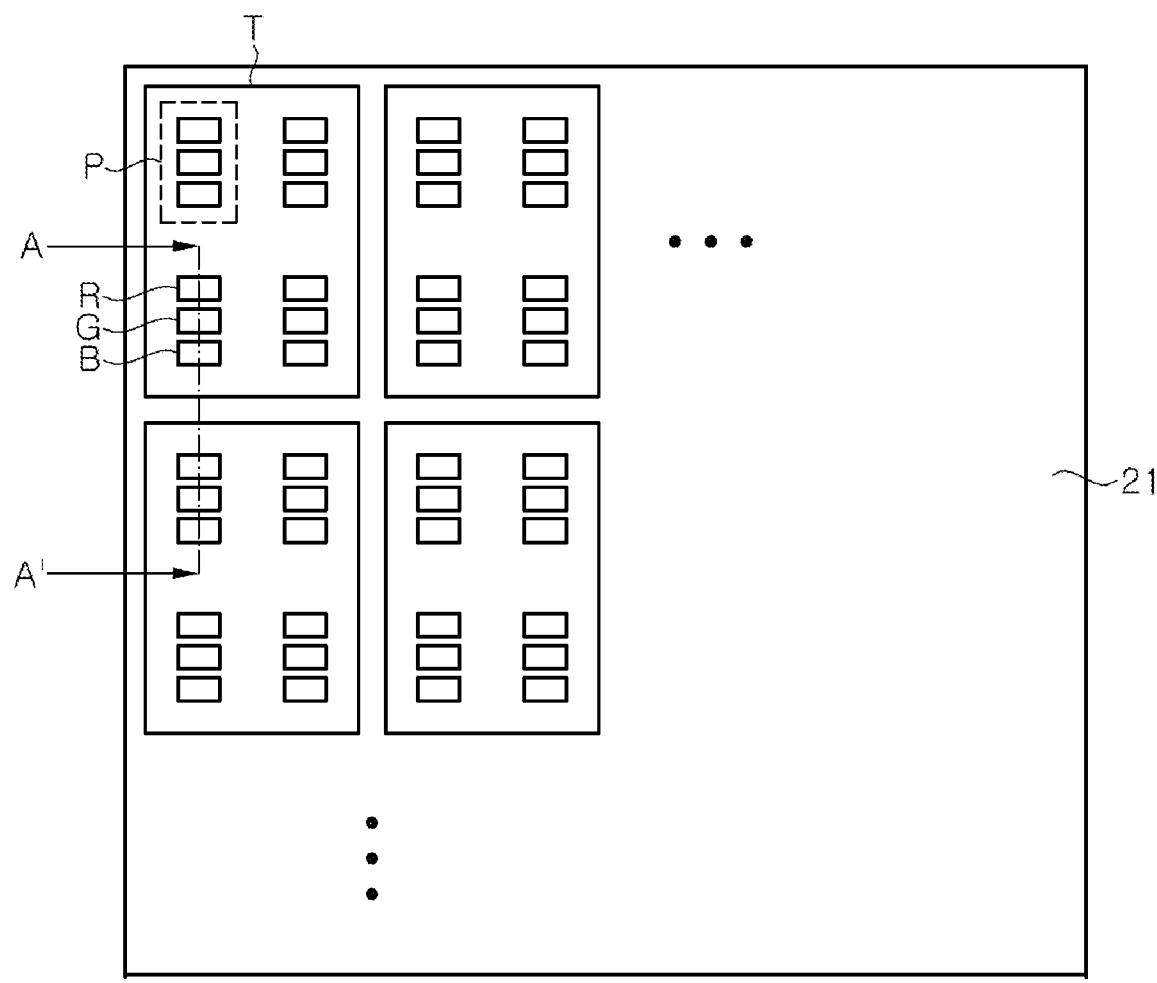
FIG. 2 is a plan view illustrating a display apparatus including micro LED modules according to the related art.
Figure 3:
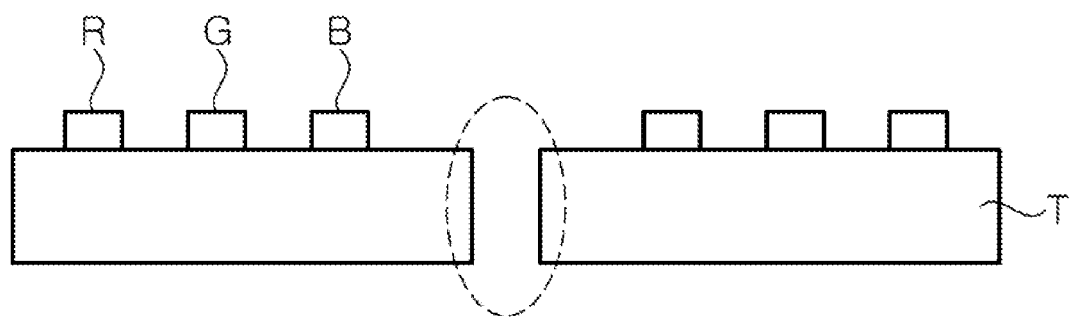
FIG. 3 is a schematic partial cross-sectional view taken along line A-A' of FIG. 2.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of devices can be exaggerated for clarity and descriptive purposes. When an element or layer is referred to as being "disposed above" or "disposed on" another element or layer, it can be directly "disposed above" or "disposed on" the other element or layer or intervening devices or layers can be present. Throughout the specification, like reference numerals denote like devices having the same or similar functions.

Exemplary embodiments provide a display apparatus. The display apparatus includes a display substrate, a first micro LED module disposed on the display substrate, and a second micro LED module disposed on the display substrate and adjacent to the first micro LED module. The first micro LED module and the second micro LED module have side surfaces facing each other. The side surfaces facing each other of the first micro LED module and the second micro LED module are inclined in an identical direction with respect to an upper surface of the display substrate.

Since the side surfaces facing each other of the first micro LED module and the second micro LED module are inclined in the identical direction, it is possible to prevent a boundary region between them from being discernible or displayed.

Herein, the inclined side surfaces facing each other of the first micro LED module and the second micro LED module does not mean a degree of inclination is identical, but means that the inclined direction is identical. In one or more exemplary embodiments, the side surfaces facing each other may have different inclined angles from each other with respect to the display substrate. In another exemplary embodiment, the side surfaces facing each other may be parallel to each other. More particularly, the inclined angles of the side surfaces facing each other may be identical.

Furthermore, in some embodiments, the side surfaces facing each other may be at least partially overlapped in the vertical direction. As the side surfaces facing each other are arranged so as to overlap with each other, it is possible to prevent a boundary region between the side surfaces from being displayed or discernible on a display.

In at least one variant, the first micro LED module and the second micro LED module may have an identical size and an identical structure. In another exemplary embodiment, the first micro LED module and the second micro LED module may have different sizes or different shapes from each other. Furthermore, the second micro LED module may be disposed between two first micro LED modules.

In another variant, the display apparatus may further include a third micro LED module disposed on the display substrate and adjacent to the first micro LED module. The first micro LED module and the third micro LED module may have side surfaces facing each other. The side surfaces facing each other of the first micro LED module and the third micro LED module may be inclined in an identical direction with respect to the upper surface of the display substrate. The side surface of the first micro LED facing the side surface of the third micro LED module may be adjacent to the side surface of the first micro LED module facing the side surface of the second micro LED module.

The third micro LED module may be disposed between two first micro LED modules.

In addition, the side surface of the third micro LED module facing the side surface of the first micro LED module may extend to face the side surface of the second micro LED module. Furthermore, the third micro LED module may be disposed between two second micro LED modules.

The first micro LED module may further include a first connector for connecting an interconnection on an upper surface of a first substrate and an interconnection on a lower surface thereof. In an exemplary embodiment, the first connector may connect the interconnection on the upper surface of the first substrate and the interconnection on the lower surface thereof through a via hole in the first substrate. In another exemplary embodiment, the first connector may be formed on a side surface of the first substrate to connect the interconnection on the upper surface of the first substrate and the interconnection on the lower surface thereof.

The first micro LED module may include a first substrate and micro LEDs arranged on the first substrate, the second micro LED module may include a second substrate and micro LEDs arranged on the second substrate, and side surfaces of the first substrate and the second substrate may face each other.

The first micro LED module may include a plurality of pixel regions, and the second micro LED module may include a plurality of pixel regions.

In addition, each of the pixel regions may be configured to emit red light, green light, and blue light.

The display apparatus may further include a molding member covering the first and second micro LED modules.

Further, the molding member may fill a region between the first micro LED module and the second micro LED module.

A micro LED module according to one or more exemplary embodiments includes a substrate having a lower surface, an upper surface, and side surfaces; and micro LEDs arranged on the upper surface of the substrate, in which at least one side surface of the substrate is inclined to have an acute angle or an obtuse angle with respect to the upper surface of the substrate.

The substrate has two pairs of opposite side surfaces, and at least one pair of opposite side surfaces may be inclined in an identical direction.

The substrate may have two pairs of opposite side surfaces, and at least one pair of opposite side surfaces may be inclined in opposite directions.

Meanwhile, the micro LED module may have a plurality of pixel regions on the upper surface of the substrate, and each of the pixel regions may be configured to emit red light, green light, and blue light.

Hereinafter, exemplary embodiments will be described in detail with reference to the accompanying drawings.

Figure 4:
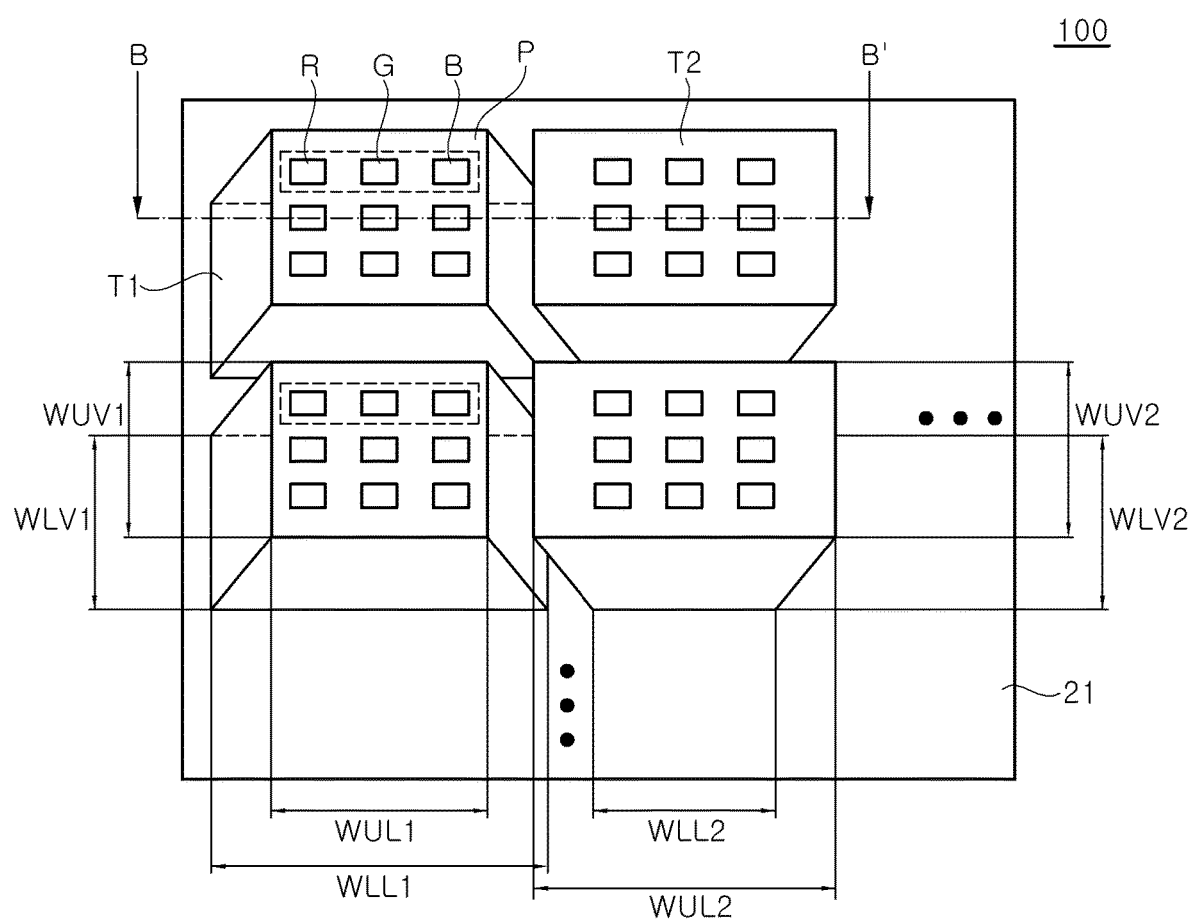
FIG. 4 is a schematic plan view illustrating a display apparatus including micro LED modules according to one or more exemplary embodiments.
Figure 5:
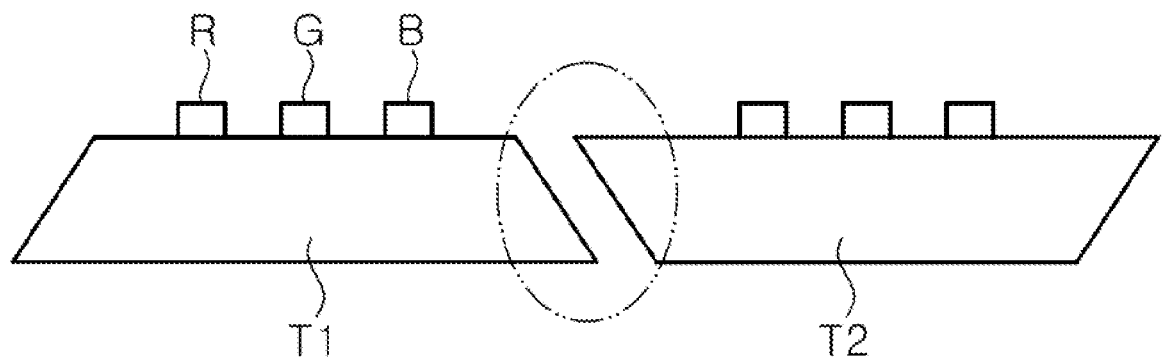
FIG. 5 is a schematic partial cross-sectional view taken along line B-B' of FIG. 4.

FIG. 4 is a schematic plan view illustrating a display apparatus including micro LED modules according to one or more exemplary embodiments, and FIG. 5 is a schematic partial cross-sectional view taken along line B-B' of FIG. 4. In the cross-sectional view of FIG. 5, a display substrate 21 is omitted.

Referring to FIGS. 4 and 5, a display apparatus 100 includes a display substrate 21, first micro LED modules T1, and a second micro LED module T2. The first and second micro LED modules T1 and T2 may include a plurality of pixels P, and each of the pixels P may include micro LEDs R, G, and B.

The display apparatus 100 is a micro LED display apparatus, and a light emitting area of one sub-pixel may be 10000 μm² or less. In other embodiments, the light emitting area of one sub-pixel may be 4000 μm² or less, and furthermore, smaller such as 1000 μm² or less.

The display substrate 21 is used to support the first and second micro LED modules T1 and T2, and is not particularly limited as long as it is capable of supporting and securing the first and second micro LED modules T1 and T2. In the illustrated exemplary embodiment, the display substrate 21 may be a circuit board including a circuit such as a TFT, but the inventive concepts are not limited thereto, and may be a substrate without a circuit, for example, a glass substrate. The display substrate 21 may have a size corresponding to a size of a screen of the display apparatus 100, but the inventive concepts are not limited thereto.

The display substrate 21 may be, for example, glass, quartz, ceramic, Si, SiC, metal, fiber, polymer, or the like, and may be a transparent or opaque substrate. In addition, the display substrate 21 may be a rigid or flexible PCB (printed circuit board).

In one or more exemplary embodiments, the display substrate 21 may be a transparent substrate such as glass, quartz, transparent ceramic, transparent film, and transparent PCB. The transparent film may be, for example, PEN (Poly Ethylene Naphthalene), PET (Poly Ethylene Terephthalate), PI (Polyimide), PE (Poly Ethylene) film, PMMA (Poly Methyl Methacrylate), or the like.

An interconnection portion on the display substrate 21 may also be formed of a transparent film such as a transparent conductive oxide film or a transparent conductive layer such as carbon nanotubes or carbon graphite, but the inventive concepts are not limited thereto. When the display substrate 21 is a transparent substrate, a background structure or setting of the display apparatus can be observed through the display substrate 21 before the display apparatus is turned on. For example, when the display substrate 21 is attached to a wall, a display screen can be hardly noticeable and a wall surface can be observed through the display screen. As the micro LEDs R, G and B have a very small size, the background can be observed through a region between the micro LEDs R, G and B. Accordingly, a transparent display apparatus, for example, a head-up display may be provided in some embodiments.

Furthermore, when the display substrate 21 is formed of a flexible plastic, a flexible display may be implemented.

In some forms, the transparent display apparatus may use a glass plate such as window glass of a building or automobile glass as the display substrate 21.

In another form, the transparent display apparatus may be manufactured using a transparent printed circuit board as the display substrate 21, and the transparent display apparatus may be attached to the glass plate such as window glass or automobile glass.

In yet another form, a flexible printed circuit board (FPCB) may be used as the display substrate 21 to manufacture a flexible display apparatus, and the flexible display apparatus may be attached to the glass plate such as window glass or automobile glass, or the flexible display apparatus may be used instead of the glass plate.

In some embodiments, the glass plate such as window glass or automobile glass or a transparent display substrate may be manufactured to have electrochromic characteristics, and light transmittance thereof may be adjusted by controlling current and voltage. In addition, transparency of the display substrate 21 may be adjusted by controlling an amount of light emitted from the micro LEDs R, G, and B in each pixel.

The first micro LED modules T1 are arranged on the display substrate 21. The first and second micro LED modules T1 and T2 may be attached on the display substrate 21 using a tiling technique. The first and second micro LED modules T1 and T2 may be arranged to be spaced apart from one another.

The first micro LED module T1 may include a plurality of pixels P disposed on a first substrate, and the pixel P may include micro LEDs R, G, and B. The first substrate may have substantially flat upper and lower surfaces. Meanwhile, as illustrated in FIG. 4, the first substrate may have inclined side surfaces with respect to an upper surface of the display substrate 21. Herein, the inclined side surface means that a side surface of the first substrate is inclined to have an acute angle or an obtuse angle with respect to the upper surface of the display substrate 21. The upper surface of the first substrate may be substantially parallel to the upper surface of the display substrate 21, and thus, the inclined side surface of the first substrate has the acute angle or the obtuse angle with respect to the upper surface of the first substrate.

As illustrated in FIG. 4, both side surfaces of the first substrate of the first micro LED module T1 at opposite ends may be inclined in opposite directions to each other. Additionally, both side surfaces of the second micro LED module T2 may be inclined in an identical direction. However, the inventive concepts are not limited thereto, and the opposite side surfaces of each pair may all be inclined in an identical direction or in opposite directions.

In the illustrated exemplary embodiment, the upper surface of the first substrate of the first micro LED module T1 may have a smaller area than that of the lower surface thereof. However, the inventive concepts are not limited thereto, and in the first substrate of the first micro LED module T1, the upper and lower surfaces thereof may have substantially the same area.

The micro LEDs R, G, and B may emit red light, green light, and blue light, respectively. In the present specification, the micro LED refers to a micro-scale luminous body manufactured using an inorganic semiconductor layer. The micro LED may generally include a first conductivity type semiconductor layer, an active layer, and a second conductivity type semiconductor layer. A structure of the micro LED may be various, such as a vertical type, a lateral type, and a flip chip type, and the inventive concepts are not particularly limited to a specific type. As available in the pertinent art, electrodes, pads, and an insulation layer for electrical connection to the micro LED may be additionally formed.

Each of the micro LEDs R, G, and B may constitute a sub-pixel, and sub-pixels arranged laterally to one another may constitute a single pixel P. In another exemplary embodiment, a stacked light emitting device in which micro LEDs R, G, and B are stacked one above another may constitute a single pixel. The stacked light emitting device may include micro LEDs emitting red light, green light, and blue light, and these micro LEDs may constitute a sub-pixel, respectively.

Meanwhile, the second micro LED modules T2 are disposed adjacent to the first micro LED modules T1. One side surface of the second micro LED module T2 may face one side surface of an adjacent first micro LED module T1. In this case, the side surfaces of the first micro LED module T1 and the second micro LED module T2 may be inclined in an identical direction with respect to the upper surface of the display substrate 21. For example, the first substrate of the first micro LED module T1 and a second substrate of the second micro LED module T2 may have side surfaces that face each other, and the side surfaces facing each other of the first substrate and the second substrate may be inclined in an identical direction with respect to the upper surface of the display substrate 21.

The first substrate and the second substrate may be transparent or opaque substrates. In an exemplary embodiment, the first substrate and the second substrate may be a transparent substrate formed of a transparent material to provide a transparent display apparatus. The first substrate and the second substrate may be, for example, the transparent substrate described with respect to the display substrate 21, and the detailed descriptions for the display substrate 21 are applied.

As illustrated in FIGS. 4 and 5, the side surfaces facing each other of the first micro LED module T1 and the second micro LED module T2 may overlap with each other. Accordingly, a boundary line between the micro LED modules T1 and T2 may be prevented from being displayed.

The second micro LED module T2 may include at least one pixel P disposed on the second substrate, and the pixel P may include micro LEDs R, G, and B. The micro LEDs R, G, and B may have an identical structure and an identical size to one another as the micro LEDs of the first micro LED module T1, but the inventive concepts are not limited thereto. The micro LEDs R, G, and B may emit red light, green light, and blue light, respectively. Each of the micro LEDs R, G, and B may constitute a sub-pixel, and sub-pixels arranged laterally to one another may constitute a pixel P. In another exemplary embodiment, a stacked light emitting device may constitute a pixel P. The stacked light emitting device may include semiconductor stacks that emit red light, green light, and blue light, respectively, and these semiconductor stacks may constitute sub-pixels, respectively.

The second micro LED module T2 may be disposed between two first micro LED modules T1. More particularly, both side surfaces of the second micro LED module T2 may be disposed to face side surfaces of different first micro LED modules T1, respectively.

As illustrated in FIG. 4, a column of the first micro LED modules T1 and a column of the second micro LED modules T2 may be alternately arranged in one direction. In each row of the first micro LED module T1 and the second micro LED module T2, the first micro LED modules T1 may be disposed such that side surfaces thereof face each other, and the second micro LED modules T2 may also be disposed such that side surfaces thereof face each other. In another form, in each column of the first micro LED module T1 and the second micro LED module T2, the first micro LED modules T1 may be disposed such that side surfaces thereof face each other, and the second micro LED modules T2 may also be disposed such that side surfaces thereof face each other. However, the inventive concepts are not limited thereto, and the first and second micro LED modules T1 and T2 may be arranged in various ways according to inclination angles of their side surfaces.

Meanwhile, in the illustrated exemplary embodiment as shown in FIG. 4 and the first micro LED module T1 has the lower surface having a larger area than that of the upper surface thereof, and the second micro LED module T2 has an upper surface having a larger area than that of a lower surface thereof. In particular, in the exemplary embodiment of FIG. 4, the upper surface of the first micro LED module T1 may have a smaller lateral width WUL1 than a lateral width WLL1 of the lower surface thereof, and may have substantially the same vertical width WUV1 as a vertical width WLV1 of the lower surface thereof. The upper surface of the second micro LED module T2 may have a larger lateral width WUL2 than a lateral width WLL2 of the lower surface thereof, and may have substantially the same vertical width WUV2 as a vertical width WLV2 of the lower surface thereof. In another exemplary embodiment, the upper surface of the first micro LED module T1 may have a smaller lateral width WUL1 and a smaller vertical width WUV1 than those WLL1 and WLV1 of the lower surface thereof, and the upper surface of the second micro LED module T2 may have a larger lateral width WUL2 and a larger vertical width WUV2 than those WLL2 and WLV2 of the lower surface thereof.

According to the illustrated exemplary embodiment, as the first micro LED module T1 and the second micro LED module T2 include the side surfaces facing each other, it is possible to prevent linear defects by a boundary portion between the micro LED modules T1 and T2 from being displayed or discernible during a display.

Figure 6:
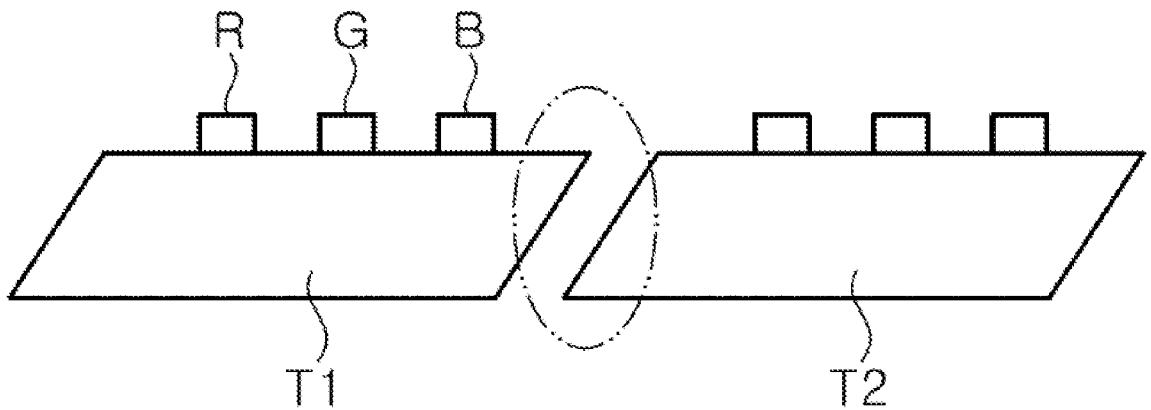
FIG. 6 is a schematic cross-sectional view illustrating a display apparatus including micro LED modules according to one or more exemplary embodiments.

FIG. 6 is a schematic cross-sectional view illustrating a display apparatus including micro LED modules according to another exemplary embodiments.

Referring to FIG. 6, the display apparatus according to the exemplary embodiment is substantially similar to the display apparatus 100 described with reference to FIGS. 4 and 5, but a first micro LED module T1 and a second micro LED module T2 in the exemplary embodiment have a pair of both side surfaces inclined in an identical direction, respectively. By way of example, the first micro LED module T1 and the second micro LED module T2 may have an identical shape. Further, the first micro LED module T1 and the second micro LED module T2 may have upper and lower surfaces thereof having substantially the same area, respectively.

Figure 7:
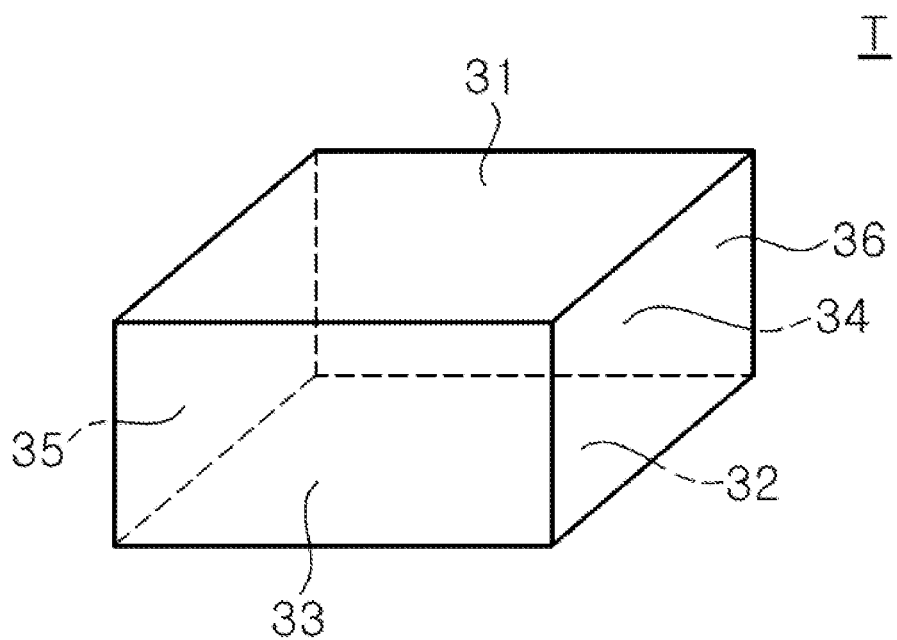
FIG. 7 is a schematic perspective view illustrating LED modules according to one or more exemplary embodiments.

FIG. 7 is a schematic perspective view illustrating micro LED modules according to exemplary embodiments. Herein, a shape of a micro LED module T will be generally described.

Referring to FIG. 7, in the illustrated embodiments, the micro LED module T may include an upper surface 31, a lower surface 32, a front side surface 33, a rear side surface 34, a left side surface 35, and a right side surface 36. Micro LEDs are arranged on the upper surface 31. Herein, the front side surface 33 and the rear side surface 34 are a pair of side surfaces opposite to each other, and the left side surface 35 and the right side surface 36 are another pair of side surfaces opposite to each other.

In the micro LED modules T of the exemplary embodiments, at least one side surface of the front side surface 33, the rear side surface 34, the left side surface 35, and the right side surface 36 is inclined to have an acute or obtuse angle with respect to the upper surface 31. Further, a pair of side surfaces thereof opposite to each other may be inclined with respect to the upper surface 31, and furthermore, all of four side surfaces thereof may be inclined to have an acute or obtuse angle with respect to the upper surface 31.

Meanwhile, the micro LED modules T may be arranged on a display substrate so that the side surfaces facing each other are inclined in an identical direction, and the side surfaces facing each other may overlap with each other.

Figure 8:
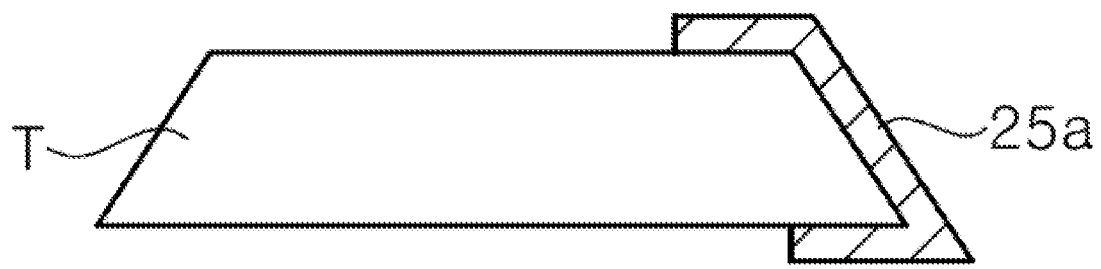
FIG. 8 is a schematic cross-sectional view illustrating a connector of a micro LED module according to one or more exemplary embodiments.

FIG. 8 is a schematic cross-sectional view illustrating a connector of a micro LED module T according to one or more exemplary embodiments.

Referring to FIG. 8, a connector 25a for connecting an upper surface of a first substrate and a lower surface thereof may be disposed on a side surface of the first substrate. The side surface of the first substrate may be inclined to have an acute angle or an obtuse angle with respect to the upper surface of the first substrate, and the connector 25a is disposed on the inclined side surface of the first substrate.

A driver (not shown in the drawing) is disposed on the lower surface of the first substrate, and for example, a scan driver for driving a scan line and a data driver for driving a data line may be disposed. Micro LEDs R, G, and B on the first substrate may be electrically connected to the driver, and may be driven by the driver. In this case, to electrically connect the micro LEDs R, G, and B disposed on the first substrate to the driver, an interconnection with the driver on the upper surface and the interconnection on lower surface of the first substrate may be connected through the connector 25a. A plurality of interconnections may be made on the upper and lower surfaces of the first substrate via a plurality of connectors 25a which are provided on the first substrate.

Figure 9:
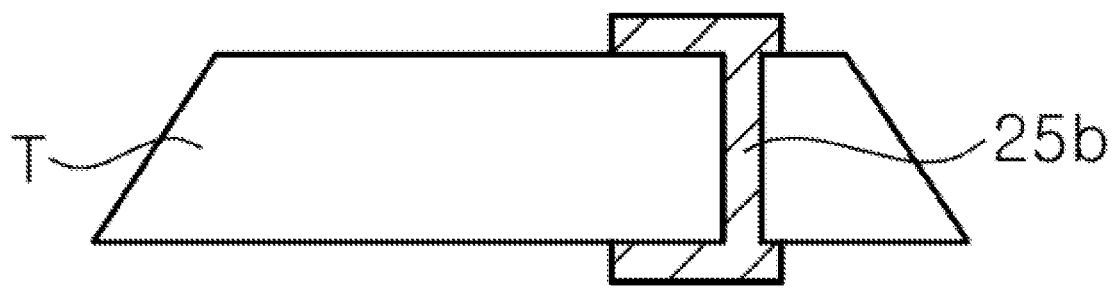
FIG. 9 is a schematic cross-sectional view illustrating a connector of a micro LED module according to one or more exemplary embodiments.

FIG. 9 is a schematic cross-sectional view illustrating a connector of a micro LED module according to one or more exemplary embodiments.

Referring to FIG. 9, a connector 25b in the illustrated exemplary embodiment is substantially similar to the connector 25a described with reference to FIG. 8, but the connector 25b is formed in a through hole passing through a first substrate. The connector 25b may be formed near an edge of the first substrate.

Figure 10:
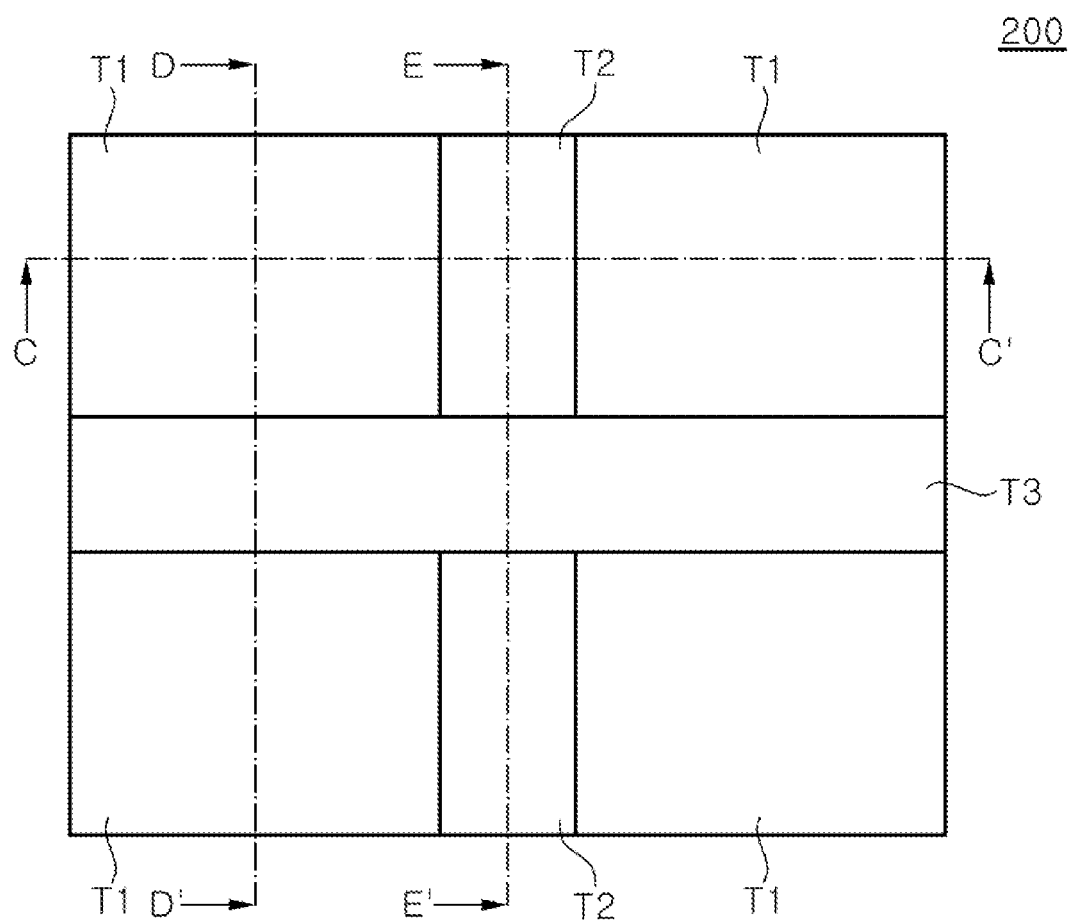
FIG. 10 is a schematic plan view illustrating a display apparatus including micro LED modules according to one or more exemplary embodiments.
Figure 11:
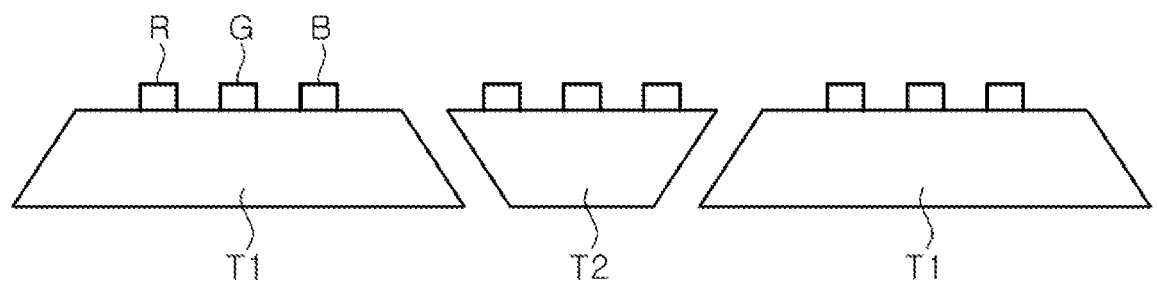
FIG. 11 is a schematic cross-sectional view taken along line C-C' of FIG. 10.
Figure 12:
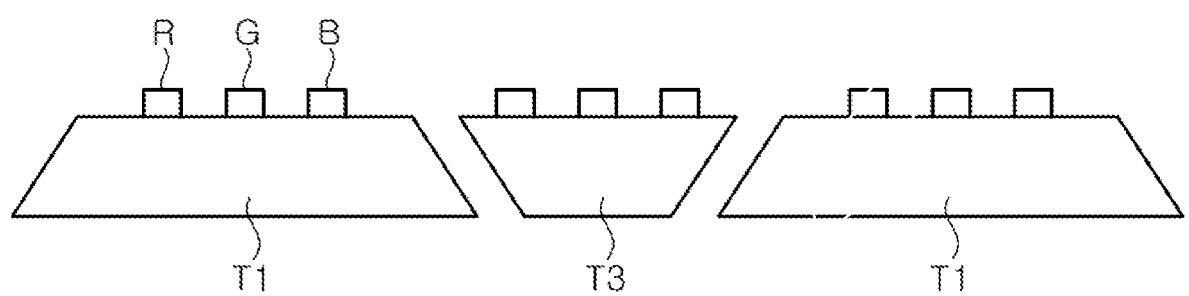
FIG. 12 is a schematic cross-sectional view taken along line D-D' of FIG. 10.
Figure 13:
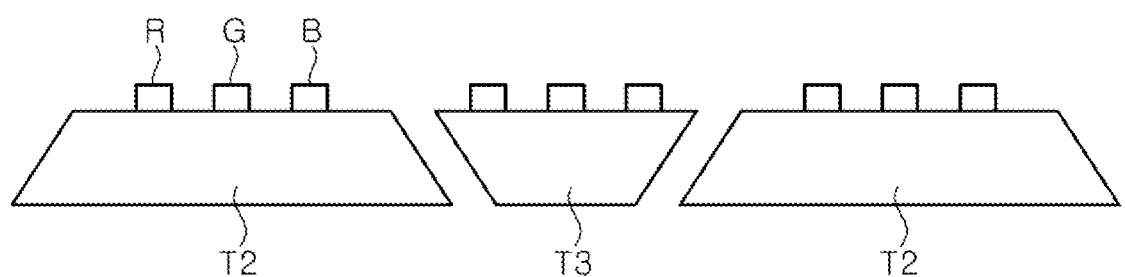
FIG. 13 is a schematic cross-sectional view taken along line E-E' of FIG. 10.

FIG. 10 is a schematic plan view illustrating a display apparatus 200 including micro LED modules according to one or more exemplary embodiments, and FIGS. 11, 12, and 13 are schematic cross-sectional views taken along lines C-C', D-D', and E-E' of FIG. 10, respectively.

Referring to FIGS. 10 and 11, the display apparatus 200 according to the exemplary embodiment may include first micro LED modules T1, second micro LED modules T2, and a third micro LED module T3. The first, second, and third micro LED modules T1, T2, and T3 may include first, second, and third substrates, respectively, and may include micro LEDs R, G, and B disposed on each substrate. The micro LEDs are omitted in FIG. 10 to simplify descriptions of the display apparatus 200 illustrated in FIG. 10. Also, a plurality of pixel regions may be disposed on the first, second, and third substrates.

The second micro LED module T2 is disposed between two first micro LED modules T1. More particularly, both side surfaces of the second micro LED module T2 face side surfaces of the first micro LED modules T1, respectively. The side surfaces facing each other of the first micro LED module T1 and the second micro LED module T2 are inclined in an identical direction with respect to the upper surface of the display substrate 21 as described with reference to FIGS. 4 and 5.

Referring to FIGS. 10 and 12, the third micro LED module T3 may be disposed on the display substrate 21 and adjacent to the first micro LED module T1. The first micro LED module T1 and the third micro LED module T3 have side surfaces facing each other. Furthermore, the side surfaces facing each other of the first micro LED module T1 and the third micro LED module T3 may be inclined in an identical direction with respect to the upper surface of the display substrate. Herein, the side surface of the first micro LED module T1 facing the side surface of the third micro LED module T3 is adjacent to the side surface of the first micro LED module T1 facing the side surface of the second micro LED module T2.

The third micro LED module T3 may be disposed between two first micro LED modules T1, as illustrated in FIG. 10. In addition, the side surface of the third micro LED module T3 facing the side surface of the first micro LED module T1 may extend to face the side surface of the second micro LED module T2. Furthermore, as illustrated in FIG. 13, the third micro LED module T3 may be disposed between two second micro LED modules T2. More particularly, both side surfaces of the third micro LED module T3 may face side surfaces of the second micro LED modules T2, respectively, and these side surfaces facing each other may overlap with each other. Although FIGS. 11-13 show spaces between the side surfaces, such spaces are illustrated to show the shape and the direction of the side surfaces. The spaces may not be present when the side surfaces of the third micro LED module T3 overlap with the side surfaces of the second micro LED modules T2.

Figure 14:
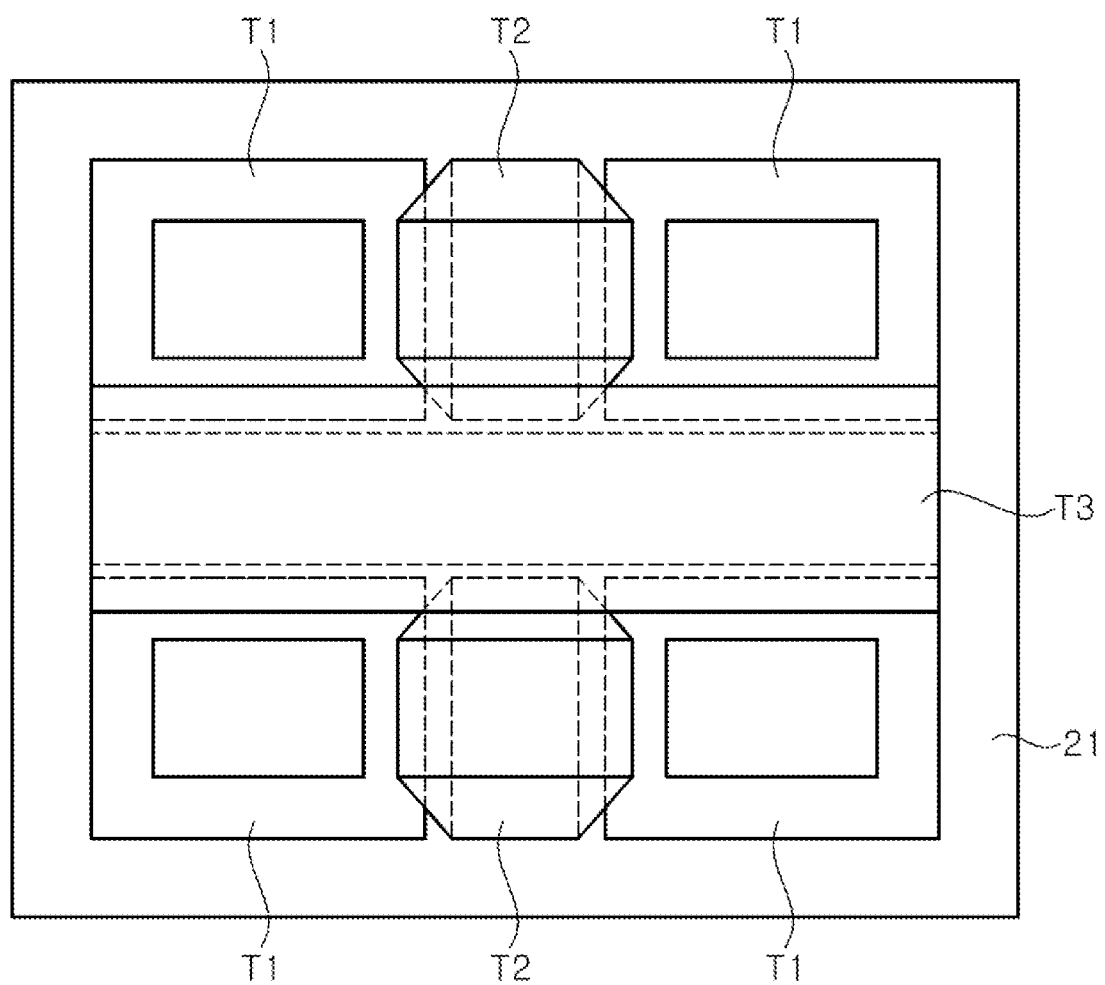
FIG. 14 is a schematic plan view illustrating a display apparatus including micro LED modules according to one or more exemplary embodiments.

FIG. 14 is a schematic plan view illustrating a display apparatus 200a including micro LED modules according to one or more exemplary embodiments.

Referring to FIG. 14, the display apparatus 200a according to the exemplary embodiment corresponds to a specific example of the display apparatus 200 described with reference to FIG. 10. The display apparatus 200a includes first micro LED modules T1, second micro LED modules T2, and a third micro LED module T3 arranged on a display substrate 21. In the exemplary embodiment, although it is exemplarily illustrated that four first micro LED modules T1, two second micro LED modules T2, and one third micro LED module T3 are disposed on the display substrate 21, a larger number of first, second, and third micro LED modules T1, T2, and T3 may be disposed on the display substrate 21.

Herein, the first micro LED module T1 may have two pairs of side surfaces in which side surfaces opposite to each other are inclined in opposite directions. The first micro LED modules T1 are disposed to be spaced apart from one another.

The second micro LED module T2 is disposed between two first micro LED modules T1. Both side surfaces of the second micro LED module T2 face side surfaces of the first micro LED modules T1, respectively. The side surfaces facing each other of the first and second micro LED modules T1 and T2 are inclined in an identical direction and at least partially overlap with each other.

Among the side surfaces of the second micro LED module T2, a pair of side surfaces facing the side surfaces of the first micro LED modules T1 are inclined to have an acute angle with respect to an upper surface of the second micro LED module T2. Meanwhile, another pair of side surfaces of the second micro LED module T2 may be inclined to have an obtuse angle with respect to the upper surface of the second micro LED module T2.

Meanwhile, the third micro LED module T3 may be disposed between the first micro LED modules T1 and the second micro LED modules T2, as shown in FIG. 14. Side surfaces of the third micro LED module T3 may face the side surfaces of the first micro LED modules T1 and the second micro LED modules T2.

Figure 15:
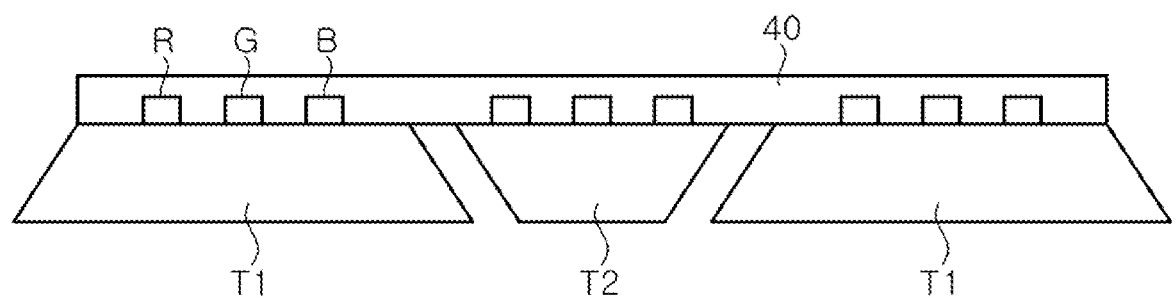
FIG. 15 is a schematic cross-sectional view illustrating a display apparatus according to one or more exemplary embodiments.

FIG. 15 is a schematic cross-sectional view illustrating a display apparatus according to one or more exemplary embodiments.

Referring to FIG. 15, the display apparatus according to the exemplary embodiment is substantially similar to the display apparatuses 100 and 200 described above, but the display apparatus further includes a molding member 40.

The molding member 40 covers micro LEDs R, G, and B on first micro LED modules T1 and a second micro LED module T2. The molding member 40 may cover all of the micro LED modules T1 and T2 on a display substrate 21. The molding member 40 may be formed of a transparent resin or may be a black molding having a light absorbing function. The black molding increases a contrast ratio and improves the quality of a final product.

Figure 16:
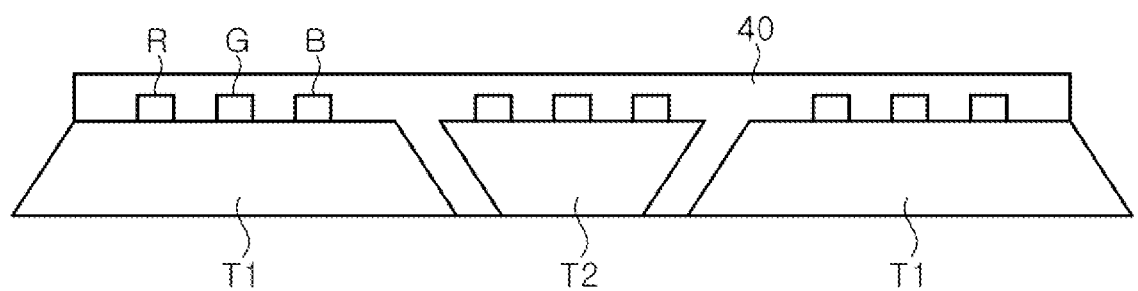
FIG. 16 is a schematic cross-sectional view illustrating another display apparatus according to one or more exemplary embodiments.

FIG. 16 is a schematic cross-sectional view illustrating a display apparatus according to one or more exemplary embodiments.

Referring to FIG. 16, the display apparatus according to the exemplary embodiment is substantially similar to the display apparatus described with reference to FIG. 15, but the molding member 40 fills a region between the first micro LED module T1 and the second micro LED module T2.

Although some embodiments have been described herein, it should be understood that these embodiments are provided for illustration only and are not to be construed in any way as limiting the present disclosure. It should be understood that features or components of an exemplary embodiment can also be applied to other embodiments without departing from the spirit and scope of the present disclosure.

The invention claimed is:

1. A display apparatus, comprising:
a display substrate;
a first micro LED module disposed on the display substrate; and
a second micro LED module disposed on the display substrate and adjacent to the first micro LED module, wherein:
the first micro LED module and the second micro LED module have side surfaces facing each other, and
the side surfaces of the first micro LED module, the second micro LED module, or both are inclined in an identical direction with respect to an upper surface of the display substrate,
wherein the first micro LED module further includes a first connector for connecting an upper surface of the first micro LED module and a lower surface of the first micro LED module, the lower surface of the first micro LED module connected to the upper surface of the display substrate,
wherein the first connector is formed on one of the side surfaces of the first LED module to connect the upper surface of the display substrate and the upper surface of the first LED module,
wherein the first connector partially overlaps a portion of the upper surface and a portion of the lower surface of the first LED module, and
wherein the first connector partially overlaps a portion of an upper surface and a portion of a lower surface of the second LED module, to form a substantially "H" shape in cross section.

2. The display apparatus of claim 1, wherein the side surfaces facing each other are parallel to each other.

3. The display apparatus of claim 1, wherein the side surfaces facing each other are at least partially overlapped in the vertical direction.

4. The display apparatus of claim 1, wherein the first micro LED module and the second micro LED module have different sizes or different shapes from each other.

5. The display apparatus of claim 1, further comprising:
a third micro LED module disposed on the display substrate and adjacent to the first micro LED module, wherein:
the first micro LED module and the third micro LED module have side surfaces facing each other,
the side surfaces facing each other of the first micro LED module and the third micro LED module are inclined in an identical direction with respect to the upper surface of the display substrate, and
the side surface of the first micro LED facing the side surface of the third micro LED module is adjacent to the side surface of the first micro LED module facing the side surface of the second micro LED module.

6. The display apparatus of claim 5, wherein the third micro LED module is disposed between two first micro LED modules.

7. The display apparatus of claim 5, wherein the side surface of the third micro LED module facing the side surface of the first micro LED module extends to face the side surface of the second micro LED module.

8. The display apparatus of claim 7, wherein the third micro LED module is disposed between two second micro LED modules.

9. The display apparatus of claim 1, wherein:
the first micro LED module includes a first substrate and micro LEDs arranged on the first substrate,
the second micro LED module includes a second substrate and micro LEDs arranged on the second substrate, and
side surfaces of the first substrate and the second substrate face each other.

10. The display apparatus of claim 1, wherein:
the first micro LED module includes a plurality of first pixel regions, and
the second micro LED module includes a plurality of second pixel regions.

11. The display apparatus of claim 10, wherein each of the first pixel regions and the second pixel regions is configured to emit red light, green light, and blue light.

12. The display apparatus of claim 1, further comprising: a molding member covering the first and second micro LED modules.

13. The display apparatus of claim 12, wherein the molding member fills a region between the first micro LED module and the second micro LED module.

14. The display apparatus of claim 1, wherein the side surfaces of the first micro LED module include:
first and second side surfaces that are positioned opposite each other on the first LED module and that are inclined in an identical direction with respect to the upper surface of the display substrate; and
third and fourth side surfaces that are positioned opposite each other on the first LED module orthogonally with respect to the first and second side surfaces of the first LED module, and that are inclined in the identical direction with respect to the upper surface of the display substrate.

15. The display apparatus of claim 14, wherein the side surfaces of the second micro LED module include:
first and second side surfaces that are positioned opposite each other on the second LED module and that are inclined in a different direction with respect to the upper surface of the display substrate; and
third and fourth side surfaces that are positioned opposite each other on the second LED module orthogonally with respect to the first and second side surfaces of the second LED module, and that are inclined in the different direction with respect to the upper surface of the display substrate.

16. The display apparatus of claim 15, wherein the upper surface of the first LED module is larger in area than the lower surface of the first LED module, and wherein the upper surface of the second LED module is larger in area than the lower surface of the second LED module.

17. A display apparatus comprising a micro LED module, the micro LED module comprising:
a substrate having a lower surface, an upper surface, and side surfaces; and
micro LEDs arranged on the upper surface of the substrate,
wherein at least one side surface of the substrate is inclined to have an acute angle or an obtuse angle with respect to the upper surface of the substrate,
wherein the micro LED module includes a first connector for connecting an upper surface of one of the micro LEDs and a lower surface of the one of the micro LEDs, the lower surface of the one of the micro LEDs connected to the upper surface of the substrate,
wherein the first connector is formed on a side surface of the one of the micro LEDs to connect the upper surface of the substrate and the upper surface of the one of the micro LEDs, and
wherein the first connector partially overlaps a portion of the upper surface and a portion of the lower surface of the one of the micro LEDs, and
wherein the first connector partially overlaps a portion of an upper surface and a portion of a lower surface of another of the micro LEDs that is positioned adjacent to the one of the micro LEDs on the substrate, wherein the first connector forms a substantially "H" shape in cross section.

18. The display apparatus of claim 17, wherein:
the substrate has two pairs of opposite side surfaces, and
at least one pair of opposite side surfaces are inclined in an identical direction.

19. The display apparatus of claim 17, wherein:
the substrate has two pairs of opposite side surfaces, and
at least one pair of opposite side surfaces are inclined in opposite directions.

20. The display apparatus of claim 17, wherein:
the micro LED module has a plurality of pixel regions on the upper surface of the substrate, and
each of the pixel regions is configured to emit red light, green light, and blue light.

* * * * *